US006251722B1

(12) United States Patent
Wei et al.

(10) Patent No.: US 6,251,722 B1
(45) Date of Patent: Jun. 26, 2001

(54) METHOD OF FABRICATING A TRENCH CAPACITOR

(75) Inventors: Houng-chi Wei, Yi Lan County; Tso-chun Tony Wang, Tai Chung, both of (TW)

(73) Assignee: Mosel Vitelic Inc. (TW)

( * ) Notice: Subject to any disclaimer, the term of this patent is extended or adjusted under 35 U.S.C. 154(b) by 0 days.

(21) Appl. No.: 09/546,800

(22) Filed: Apr. 11, 2000

(30) Foreign Application Priority Data

Dec. 9, 1999 (TW) .................................................. 88121730

(51) Int. Cl.[7] .............................................. H01L 21/8242
(52) U.S. Cl. .......................... 438/243; 438/244; 438/248; 438/387; 438/389
(58) Field of Search ................................... 438/243, 389, 438/244, 248, 387

(56) References Cited

U.S. PATENT DOCUMENTS

| 4,833,094 | * | 5/1989 | Kenney | 437/47 |
| 5,595,926 | * | 1/1997 | Tseng | 437/52 |
| 5,753,549 | * | 5/1998 | Lee | 438/243 |
| 5,985,729 | * | 11/1999 | Wu | 438/389 |
| 6,015,731 | * | 1/2000 | Kohyama et al. | 438/243 |
| 6,077,739 | * | 6/2000 | Chang | 438/243 |

\* cited by examiner

*Primary Examiner*—Matthew Smith
*Assistant Examiner*—V. Yevsikov
(74) *Attorney, Agent, or Firm*—Martine Penilla & Kim, LLP

(57) ABSTRACT

A method of fabricating a trench capacitor having high capacitance for ULSI technology below the sub-micrometer scale is provided. The method includes: form a trench on a semiconductor substrate. The trench has a bottom portion and at least one sidewall on the semiconductor substrate. Then, form a diffusion layer in the silicon substrate for circumscribing the bottom portion of the trench and a predetermined region of its sidewall. After that, form a first polysilicon layer on the bottom portion of the trench and in a manner that a portion of the first polysilicon layer does not contact with the sidewall. Then, form a first dielectric layer to completely cover the first polysilicon layer and the diffusion layer. Then, form an upper electrode layer on top of the trench to at least completely cover the first dielectric layer. Eventually, the contact area between the diffusion layer and the dielectric layer has been largely increased so as to maintain sufficient capacitance.

19 Claims, 8 Drawing Sheets

METHOD OF FABRICATING A TRENCH CAPACITOR

BACKGROUND OF THE INVENTION

1. Field of the Invention

The present invention relates to a method of fabricating a trench capacitor, especially to a method of fabricating a trench capacitor having high capacitance for the semiconductor manufacturing technology below the sub-micrometer scale.

2. Related Art

The dynamic random access memory (DRAM) has been widely used in the computer and electronic products for storing digital information on arrays of memory cells in the form of charge stored on a capacitor. Each memory cell consists of a single access transistor and a single storage capacitor. Refer to FIG. 1 for showing the circuit diagram of a conventional DRAM memory cell. A DRAM memory cell 1 consists of an NMOS transistor 11 and a capacitor 12. The NMOS transistor 11 includes a gate electrode 111 electrically connected to a word line 13 (WL) and a drain electrode 112 electrically connected to a bit line 14 (BL). One terminal of the capacitor 12 is electrically connected to an operation voltage 121 (½ VCC). The other terminal of the capacitor 12 is electrically connected to the source electrode 113 of the transistor 11. The NMOS transistor 11 operates as a switch in response to the signal on the word line 13. When the signal on the word line 13 is 1 (High), the NMOS transistor 11 is turned on, which causes the digital data on the bit line 14 to be stored in the capacitor 12. On the other hand, when the signal on the word line 13 is 0 (Low), the NMOS transistor 11 is cut-off, which causes the capacitor 12 to latch a signal.

The storage capacitors are formed by etching trenches in the substrate in each of the cell areas, commonly referred to as trench capacitors. They may also be formed over the access transistors in the cell areas by depositing and patterning conducting layers over the access transistors, commonly referred to as stacked capacitors.

Refer to FIG.2 for showing the structure of a conventional trench capacitor 2. It includes a semiconductor substrate 21, a diffusion layer 22, a dielectric layer 23, and an upper electrode 24. The diffusion layer 22 acts as the bottom electrode of the trench capacitor 2. The dielectric layer 23 is usually formed by an oxide/nitride/oxide (ONO) layer for acting as the dielectric layer of the trench capacitor 2. The upper electrode 24 is formed by a polysilicon layer.

From the illustration of FIG. 2, it would be obvious that the capacitance of the trench capacitor 2 increases as the contact area between the diffusion layer 22 and the dielectric layer 23 increases. However, since each capacitor lie within an area cannot be larger than the size of the cell area in order to accommodate all the capacitors in the large array of cells used on the DRAM device. It is becoming increasingly difficult to fabricate more memory cells on a DRAM device while limiting the overall DRAM device area to a practical size without decreasing the cell area. In that case, as the cell area decreases, the available area for the storage capacitor in each cell also decreases. This makes it difficult to maintain sufficient capacitance.

SUMMARY OF THE INVENTION

Accordingly, it is an object of the present invention to provide a method of fabricating a trench capacitor having high capacitance for ULSI technology below the sub-micrometer scale.

In accordance with the present invention, the method of fabricating a trench capacitor includes the steps of: form a trench on a semiconductor substrate. The trench has a bottom portion and at least one sidewall on the semiconductor substrate. Then, form a diffusion layer in the silicon substrate for circumscribing the bottom portion of the trench and a predetermined region of its sidewall. After that, form a first polysilicon layer on the bottom portion of the trench and in a manner that a portion of the first polysilicon layer does not contact with the sidewall. Then, form a first dielectric layer to completely cover the first polysilicon layer and the diffusion layer. Then, form an upper electrode layer on top of the trench to at least completely cover the first dielectric layer. Eventually, the contact area between the diffusion layer and the dielectric layer has been largely increased so as to maintain sufficient capacitance.

BRIEF DESCRIPTION OF THE DRAWINGS

These and other objects and advantages of the present invention will become apparent by reference to the following description and accompanying drawings wherein.

DESCRIPTION OF PREFERRED EMBODIMENTS

A preferred embodiment of the invention is described below. This embodiment is merely exemplary. Those skilled in the art will appreciate that changes can be made to the disclosed embodiment without departing from the spirit and scope of the invention.

Figure 3:
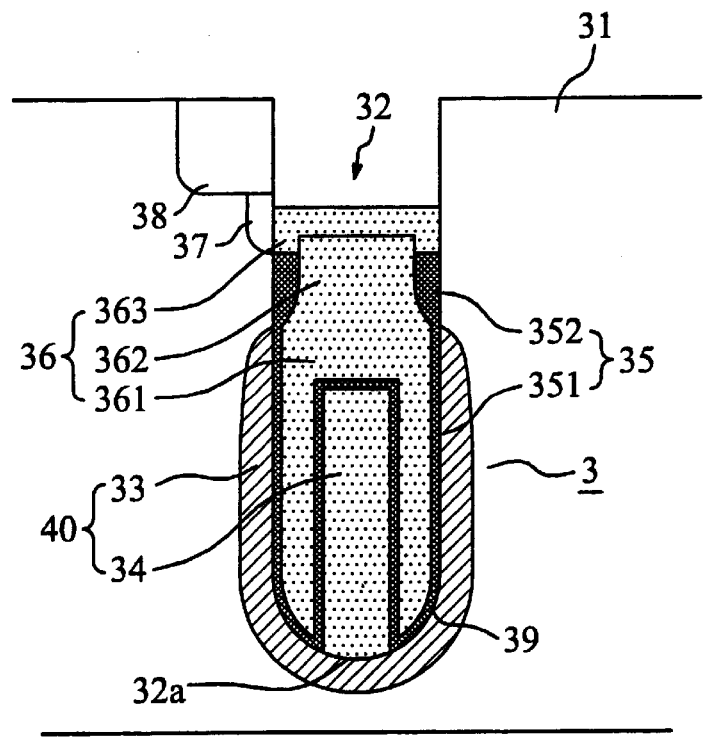
FIG. 3 is a cross-sectional view schematically showing the structure of a trench capacitor according to a preferred embodiment of the present invention.

Refer to FIG. 3, the trench capacitor 3 of the present invention includes a p-type semiconductor substrate 31, a trench 32 formed on the p-type semiconductor substrate 31. The trench 32 is composed of a bottom portion 32a and at least one sidewall 39. A bottom electrode 40 is composed of an n-type impurity diffusion layer 33 and a polysilicon layer 34. The n-type impurity diffusion layer 33 is formed in the substrate 31 adjacent to the lower portion of the trench 32, including the bottom portion 32a and the sidewall 39. The polysilicon layer 34 is vertically formed on the bottom portion 32a of the trench 32.

The dielectric layers 35 including a first dielectric layer 351 and a second dielectric layer 352 are formed in a manner that the dielectric layers 35 at least completely overlap the inner surfaces of the first polysilicon layer 34 and the n-type impurity diffusion layer 33. An upper electrode 36 is formed by overlapping the surface of the dielectric layers 35, and composed of the second polysilicon layer 361, the third polysilicon layer 362 and the fourth polysilicon layer 363.

As illustrated in FIG.3, the dielectric layers 35 are usually formed by the ON (Oxide/Nitride) or the ONO(Oxide/Nitride/Oxide) structure so as to reduce the stress between a nitride layer and a silicon substrate.

Figure 1:
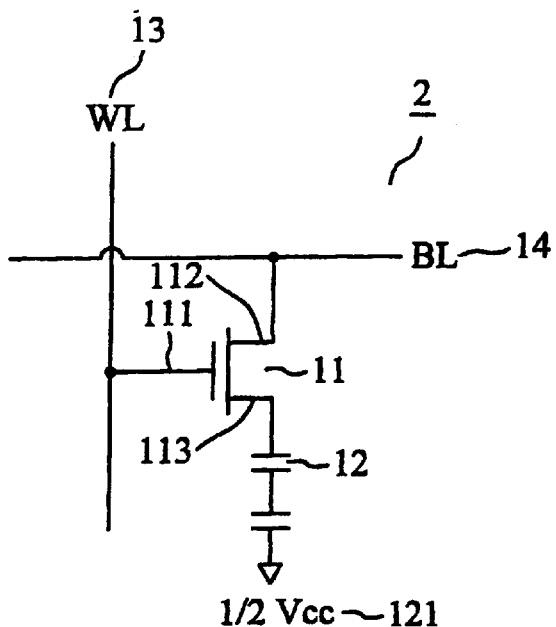
FIG. 1 is a circuit diagram showing the structure of a conventional DRAM memory cell.
Figure 2:
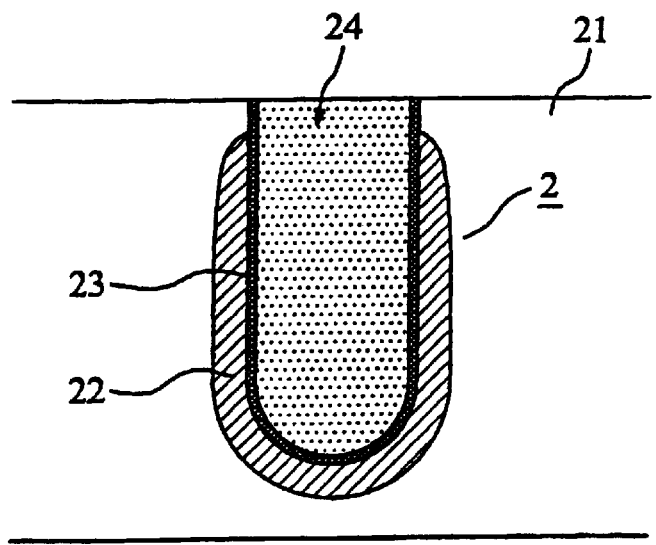
FIG. 2 is a cross-sectional view schematically showing the structure of a conventional trench capacitor.

The difference between the trench capacitor 3 of FIG.3 and the conventional trench capacitor 2 of FIG.2 is in the bottom electrode. As illustrated in FIG. 3, an additional polysilicon layer 34 is vertically formed on the bottom portion 32a to increase the total surface area of the trench capacitor 3. Eventually, the total capacitance of the trench capacitor 3 can be increased due to the additional area formed by the polysilicon layer 34.

Furthermore, the trench capacitor 3 as illustrated in FIG. 3 can also be used in the MINT (Merged Isolation and Node Trench cell) and buried strap structure. In that case, the fourth polysilicon layer 363 acts as a conducting layer which is electrically connected to the buried layer 37 and indirectly to the source diffusion layer 38 of the NMOS. Moreover, a shallow trench isolation layer (not shown) for insulation can be directly formed on top of the fourth polysilicon layer 363 to prevent leakage current without consume another chip area. Eventually, the structure of the trench capacitor 3 can save at least 25% of the chip area and efficiently reduce the manufacturing cost.

Furthermore, it should be noticed that the thickness of the second dielectric layer 352 is formed larger than that of the first dielectric layer 351. Since the buried layer 37, the p-type substrate 31 and the n-type impurity diffusion layer 33 together forms a vertical transistor, the structure of the dielectric layers 35 formed in this manner can prevent from generating a parasitic NMOS or leakage current.

Figure 4:
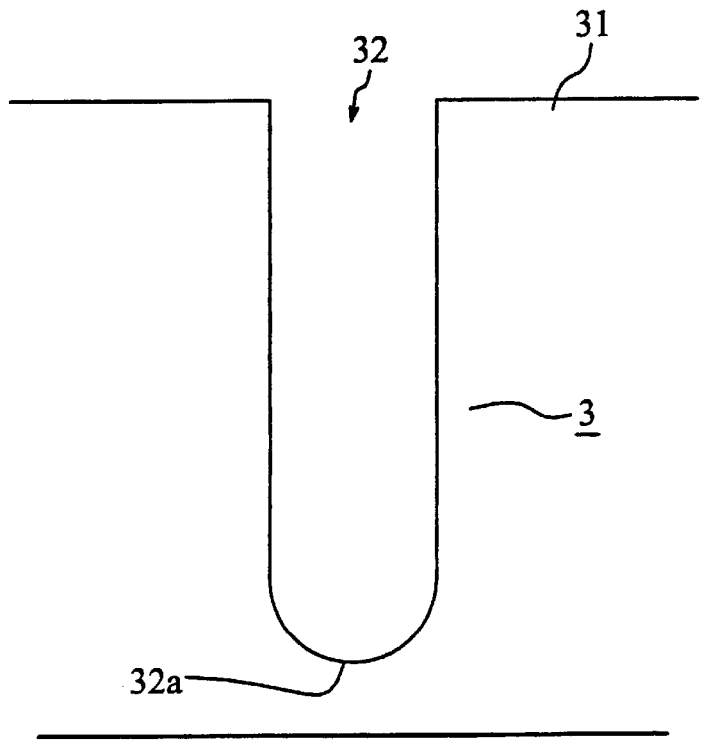
FIG. 4 to FIG. 16 are cross-sectional views schematically showing the process steps of forming the structure of the trench capacitor according to the method of the present invention.

The manufacturing process for forming the trench capacitor 3 is described below with the reference to FIG. 4~FIG. 16. Refer to FIG. 4, form a trench structure 32 on a semiconductor substrate 31. The trench 32 has a bottom portion 32a and at least one sidewall 39.

Figure 5:
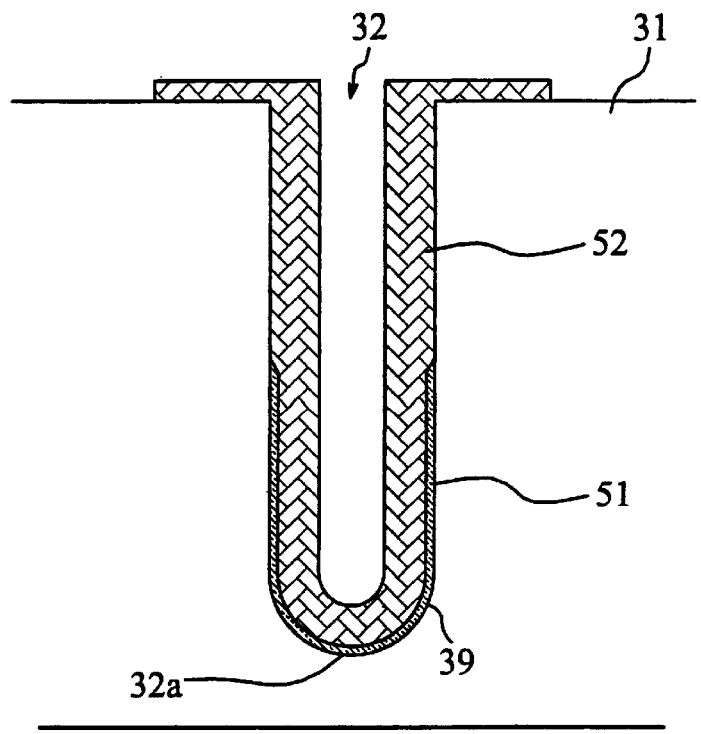

Then, deposit an ASG (Arsenic Silicate Glass) layer 51 in the trench 32 by the process of Chemical Vapor Deposition (CVD). And then, perform photolithography to define and etch the ASG layer 51 in a manner that the ASG layer 51 is defined at the bottom portion 32a and the predetermined regions on the sidewall 39 as shown in FIG. 5. After that, deposit a passivation layer 52 to overlap the inner surface of the trench 32 including the ASG layer 51 as shown in FIG.5. The passivation layer 52 can be formed by a TEOS oxide layer.

Figure 6:
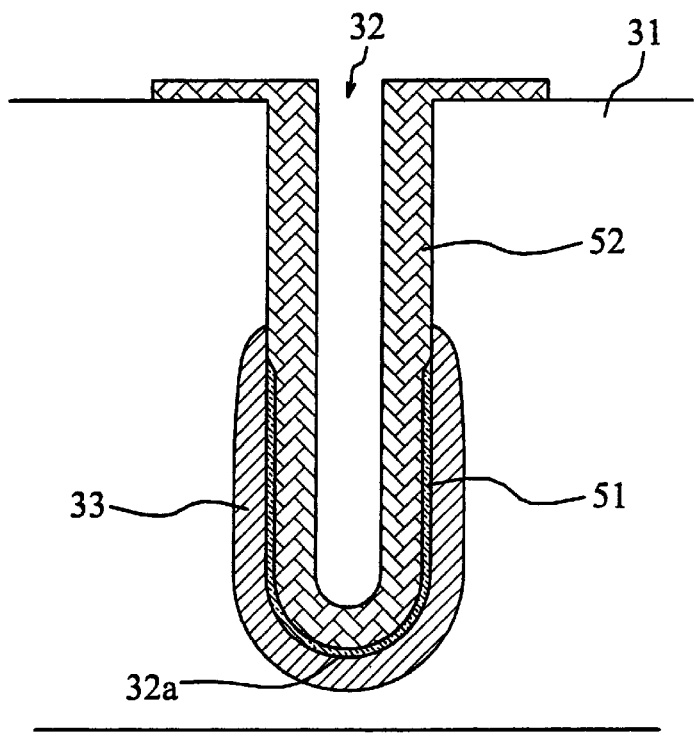

Then, perform the process of thermal annealing at about 1000° C. to 1100° C. Due to the high temperature, the Arsenic components (As) in the ASG layer 51 diffuse into the substrate 31 and form an n-type impurity diffusion layer 33 at the lower portion of the trench 32, as shown in FIG.6. The passivation layer 52 prevents the As from out diffusing to other regions of the trench 32.

Figure 7:
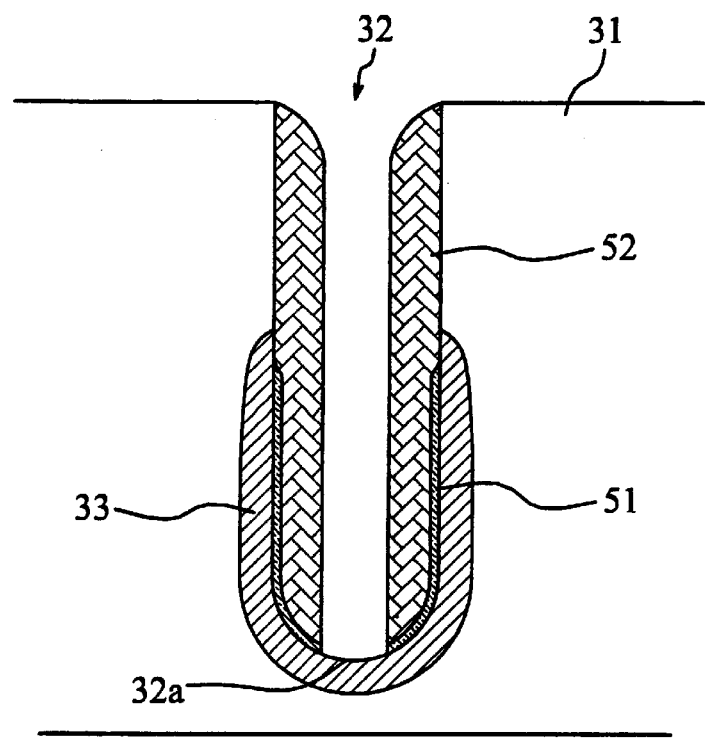

Then, perform the process of anisotropic etching back to remove a portion of the ASG layer 51 and a portion of the passivation layer 52 at the bottom of the trench 32 to expose the bottom portion 32a of the trench 32, as shown in FIG.7. The subsequent processes will be performed on the bottom portion 32a.

Figure 8:
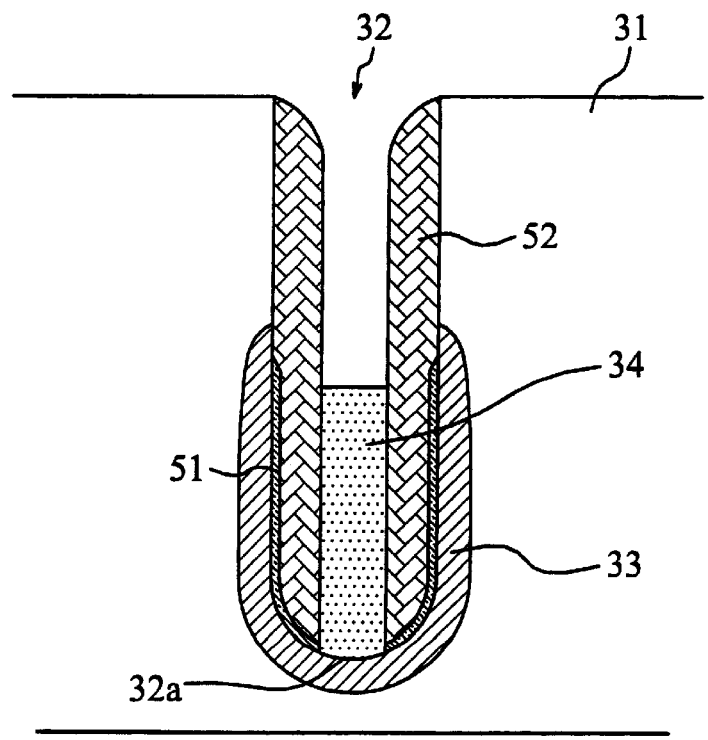

Then, perform the process of in-situ doping CVD to fill the trench 32 and cover the bottom portion 32a of the trench 32 by a polysilicon layer 34. After that, perform the process of dry etching to etch back the polysilicon layer 34 and form a stacked first polysilicon layer 34, as shown in FIG.8.

Figure 9:
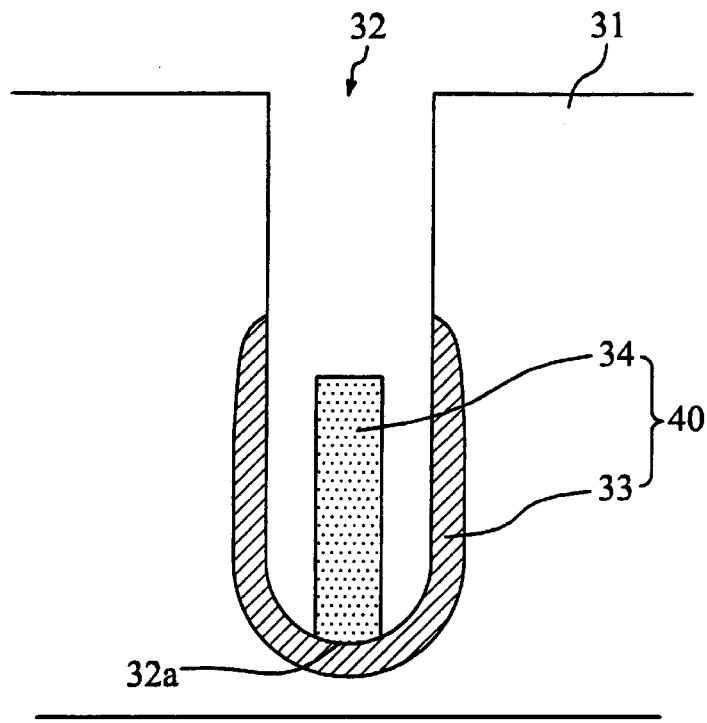

Then, perform the process of wet etching by dilute HF or BOE buffer oxide etcher) to completely remove the ASG layer 51 and the passivation layer 52 and leave the first polysilicon layer 34 intact in the trench 32, as shown in FIG.9. The first polysilicon layer 34 and the n-type impurity diffusion layer 33 together form a bottom electrode 40 in the trench 32.

Figure 10:
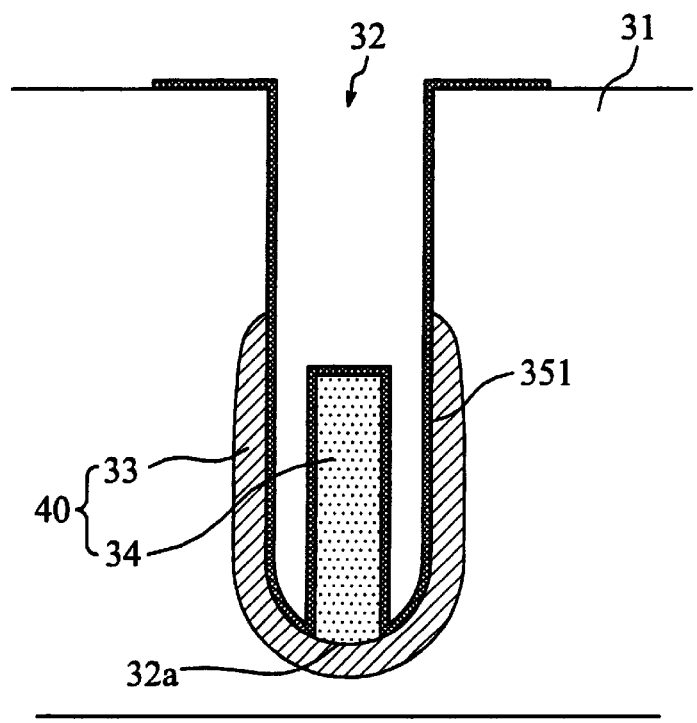

Then, perform the process of CVD to overlap a first dielectric layer 351 on the surface of the bottom electrode 40 which is constituted by the first polysilicon layer 34 and the n-type impurity diffusion layer 33, as shown in FIG. 10. The dielectric layer 351 can be generally formed by the structure of oxide/nitride/oxide (ONO) or the composition of oxide and nitride.

Figure 11:
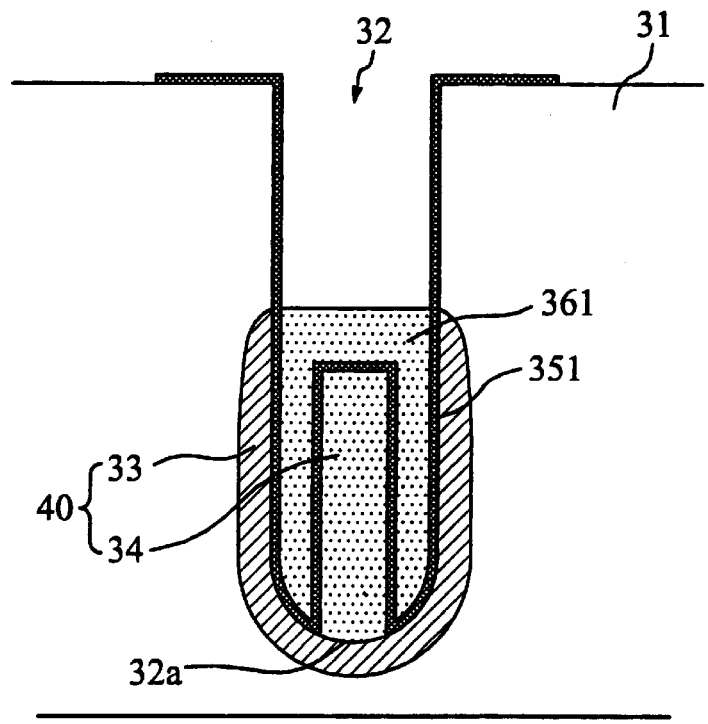

After that, perform the process of in-situ doping CVD to fill the trench 32 by another polysilicon layer 361. Then, etch back the polysilicon layer 361 to a depth, about 1 μm±0.2 μm, sufficient enough for covering the bottom electrode 40, as shown in FIG. 11.

Figure 12:
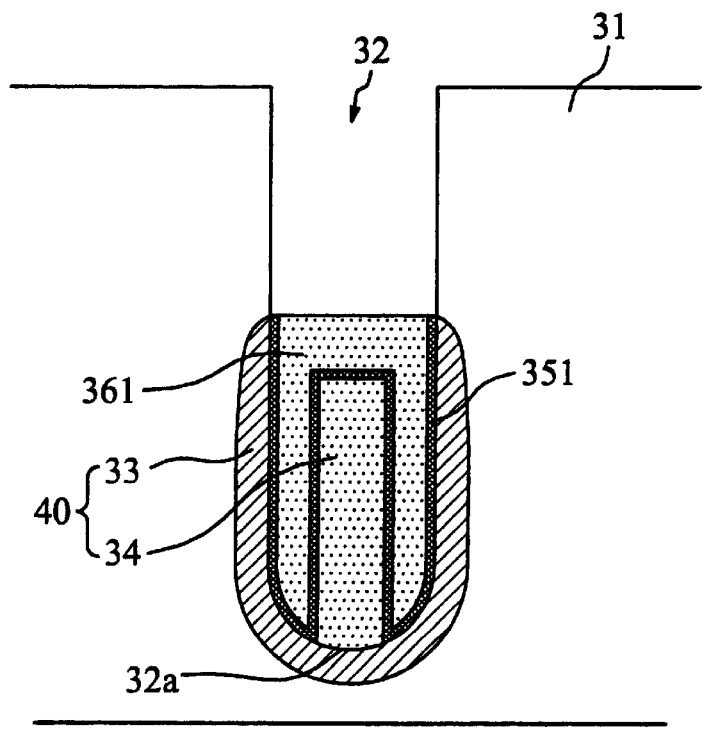

After that, perform the process of wet etching to remove the portion of the first dielectric layer 351, which is uncovered by the second polysilicon layer 361, as shown in FIG. 12.

Figure 13:
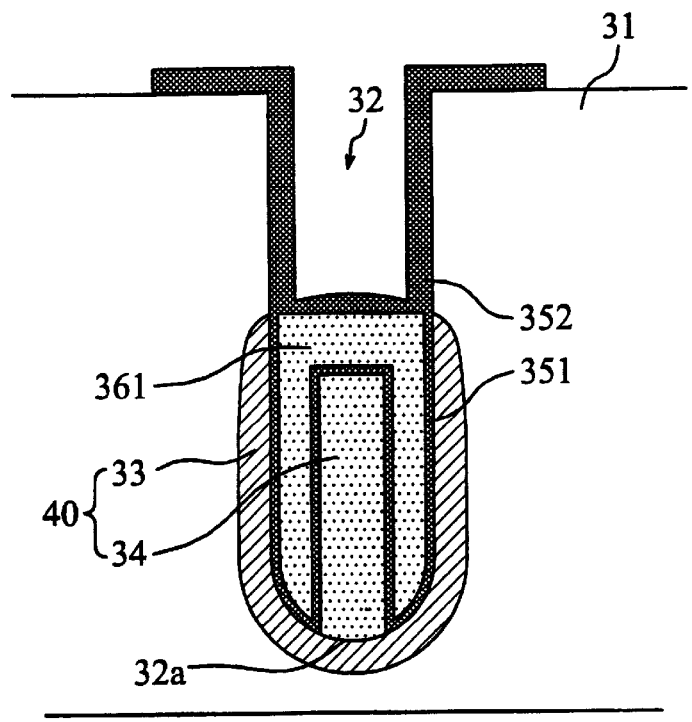

Then, perform the process of CVD to overlap the trench 32 by depositing the second dielectric layer 352 in a manner as shown in FIG. 13.

Figure 14:
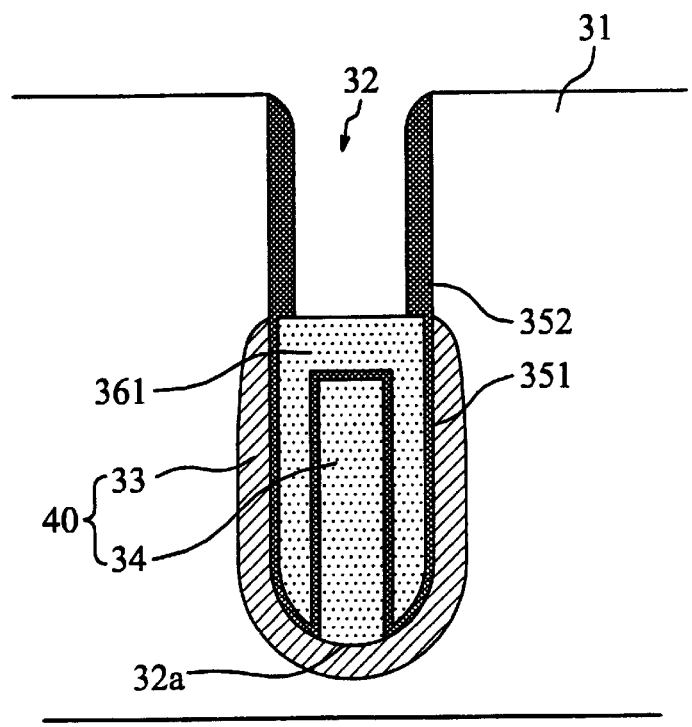

After that, perform the process of dry etching to remove a portion of the second dielectric layer 352 on top of the polysilicon layer 361 to expose the first polysilicon layer 361, as shown in FIG. 14.

Figure 15:
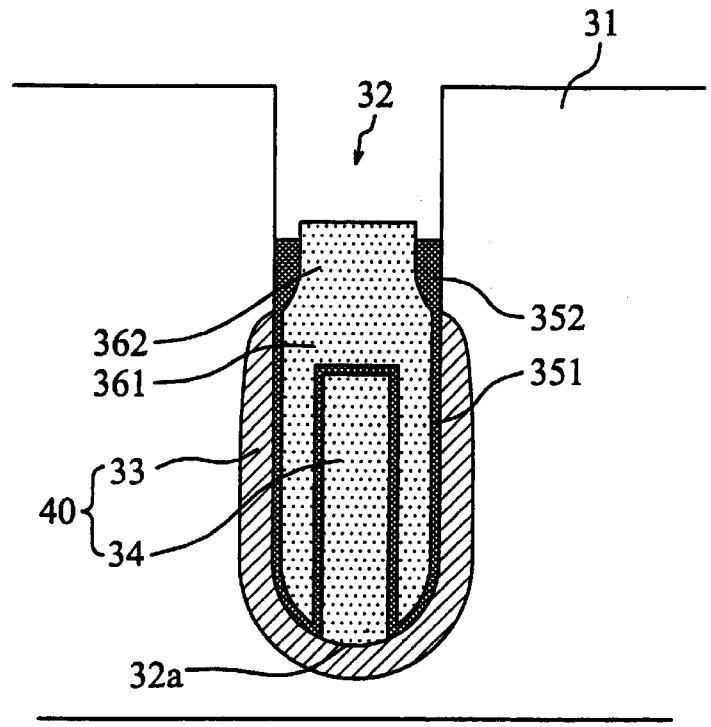

Then, perform the process of CVD to fill the trench 32 by depositing another polysilicon layer 362. Then, etch back the third polysilicon layer 362 to a depth about 3000 Å±300 Å. After that, perform the process of wet etching back to remove portions of the exposed second dielectric layer 352 to a depth lower than the polysilicon layer 362, as shown in FIG.15.

Figure 16:
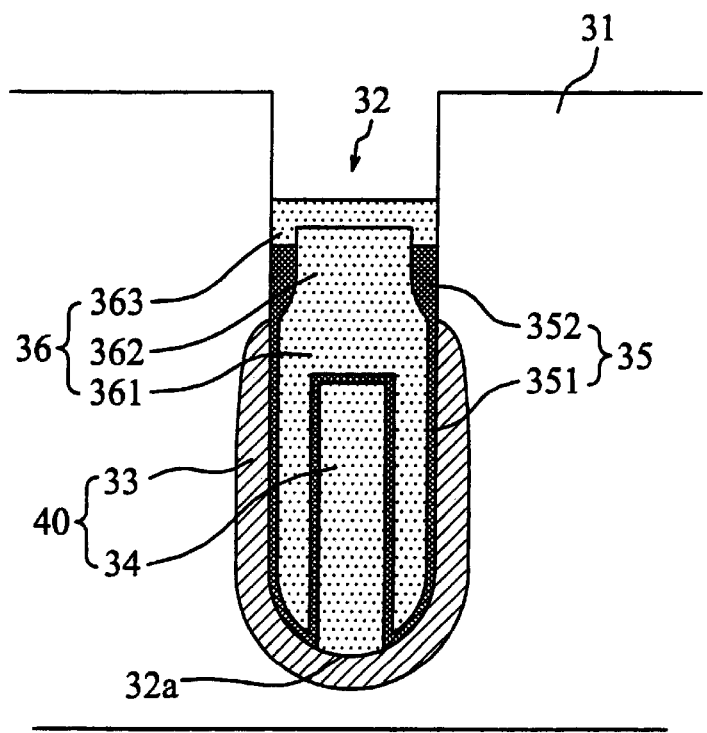

And then, perform the process of CVD to deposit another polysilicon layer 363 for completely covering the third polysilicon layer 362 and the second dielectric layer 352. Then, etch back the polysilicon layer 363 to a predetermined depth 2000 Å±300 Å for forming the final structure of the trench capacitor of the present invention, as shown in FIG. 16.

A preferred embodiment has been described in detail hereinablove. It is to be understood that the scope of the invention also comprehends embodiments different from the one described, yet within the scope of the claims. For example, the trench capacitor 3 of the invention is not limited to the MINT cells. The structure of the trench capacitor 3 is also applicable to other types of trench capacitors. Moreover, the dielectric layers of the present invention are not limited to the structures of ON or ONO. Other types of high-k dielectrics, such as BST ($B_a$, $S_r$) $T_iO_3$ and PZT (Lead Zirconate Titanate), can also perform the same functions. Furthermore, if the effect of the parasitic NMOS transistor is negligible, it's not necessary to form the third polysilicon layer 362 and the second dielectric layer 352.

While this invention has been described with reference to a preferred embodiment, this description is not intended to be construed in a limiting sense. Various modifications and combinations of the embodiment will be apparent to those skilled in the art upon reference to the description. It is therefore intended that the appended claims encompass all such modifications or embodiments.

What is claimed is:

1. A method of fabricating a trench capacitor comprising the steps of:

forming a trench having a bottom portion and at least one sidewall on a semiconductor substrate;

forming a diffusion layer in said semiconductor substrate adjacent to a lower portion of said trench including a bottom portion and a predetermined region in said at least one sidewall of said trench;

forming a first polysilicon layer on said bottom portion of said trench in a manner that a portion of said first polysilicon layer does not contact with said at least one sidewall;

forming a first dielectric layer to overlap said first polysilicon layer and said diffusion layer; and forming an upper electrode layer for completely covering said first dielectric layer.

2. A method of fabricating a trench capacitor as claimed in claim 1, wherein said upper electrode is a polysilicon layer.

3. A method of fabricating a trench capacitor as claimed in claim 1, wherein said step of forming said diffusion layer comprises the steps of:

depositing a silicate glass layer in said trench;

defining and etching said silicate glass layer in a manner that said silicate glass layer overlapping said bottom portion and a predetermined portion of said at least one sidewall of said trench;

depositing a passivation layer for overlapping said silicate glass layer; and performing a process of thermal annealing to out diffuse impurities of said silicate glass layer into said semiconductor substrate.

4. A method of fabricating a trench capacitor as claimed in claim 3, wherein said step of forming said first polysilicon layer comprises the steps of:

removing a predetermined portion of said passivation layer and said silicate glass layer to expose said diffusion layer at said bottom portion of said trench;

forming a conducting polysilicon layer;

etching back said conducting polysilicon layer to form said first polysilicon layer; and completely removing said passivation layer and said silicate glass layer.

5. A method of fabricating a trench capacitor as claimed in claim 3, wherein said impurities are As.

6. A method of fabricating a trench capacitor as claimed in claim 3, wherein said passivation layer is a TEOS oxide layer.

7. A method of fabricating a trench capacitor as claimed in claim 3, wherein the temperature of said thermal annealing is at about 1000° C. to 1100° C.

8. A method of fabricating a trench capacitor as claimed in claim 1, wherein said step of forming said upper electrode layer comprises the steps of:

forming a second polysilicon layer in said trench;

etching back said second polysilicon layer to a predetermined depth;

etching back said first dielectric layer to a predetermined depth;

forming a second dielectric layer having a thickness larger than that of said first dielectric layer to cover said at least one sidewall; and forming a third polysilicon layer to cover said second dielectric layer and said second polysilicon layer.

9. A method of fabricating a trench capacitor as claimed in claim 8, further comprises the steps of:

etching back said third polysilicon layer to a predetermined depth;

wet etching back said second dielectric layer to a predetermined depth; and forming a fourth polysilicon layer to cover said second dielectric layer and said third polysilicon layer.

10. A method of fabricating a trench capacitor as claimed in claim 8, wherein said first dielectric layer and said second dielectric layer are formed by silicon dioxide, silicon nitride, silicon dioxide/silicon nitride or silicon dioxide/silicon nitride/silicon dioxide layers.

11. A method of fabricating a trench capacitor as claimed in claim 8, wherein said first dielectric layer and said second dielectric layer are formed by the process of Chemical Vapor Deposition (CVD).

12. A method of fabricating a trench capacitor as claimed in claim 8, wherein said step of etching said first dielectric layer is performed by wet etching.

13. A method of fabricating a trench capacitor comprising the steps of:

forming a trench having a bottom portion and at least one sidewall on a semiconductor substrate;

depositing a silicate glass layer in said trench;

defining and etching said silicate glass layer in a manner that said silicate glass layer overlapping said bottom portion and a predetermined portion of said at least one sidewall of said trench;

depositing a passivation layer for overlapping said silicate glass layer;

performing a process of thermal annealing to out diffuse impurities of said silicate glass layer into said semiconductor substrate;

removing a predetermined portion of said passivation layer and said silicate glass layer to expose said diffusion layer at said bottom portion of said trench;

forming a first polysilicon layer;

etching back said first polysilicon layer; and completely removing said passivation layer and said silicate glass layer;

forming a first dielectric layer to overlap said first polysilicon layer and said diffusion layer;

forming a second polysilicon layer in said trench;

etching back said second polysilicon layer to a predetermined depth;

etching back said first dielectric layer to about said predetermined depth;

forming a second dielectric layer having a thickness larger than that of said first dielectric layer to cover said at least one sidewall;

forming a third polysilicon layer;

etching back said third polysilicon layer to a second predetermined depth;

wet etching back said second dielectric layer to about said predetermined depth; and forming a fourth polysilicon layer to cover said second dielectric layer and said third polysilicon layer.

14. A method of fabricating a trench capacitor as claimed in claim 13, wherein said impurities are As.

15. A method of fabricating a trench capacitor as claimed in claim 13, wherein said passivation layer is a TEOS oxide layer.

16. A method of fabricating a trench capacitor as claimed in claim 13, wherein the temperature of said thermal annealing is at about 1000° C. to 1100° C.

17. A method of fabricating a trench capacitor as claimed in claim 13, wherein said first dielectric layer and said second dielectric layer are formed by silicon dioxide, silicon nitride, silicon dioxide/ silicon nitride or silicon dioxide/ silicon nitride/silicon dioxide layers.

18. A method of fabricating a trench capacitor as claimed in claim 13, wherein said first dielectric layer and said second dielectric layer are formed by the process of Chemical Vapor Deposition.

19. A method of fabricating a trench capacitor as claimed in claim 13, wherein said step of etching said first dielectric layer is performed by wet etching.

* * * * *